United States Patent
Kim et al.

(10) Patent No.: US 8,270,229 B2
(45) Date of Patent: Sep. 18, 2012

(54) SEMICONDUCTOR MEMORY APPARATUS

(75) Inventors: Kyung Hoon Kim, Gyeonggi-do (KR);
Sang Sic Yoon, Gyeonggi-do (KR);
Hong Bae Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/158,778

(22) Filed: Jun. 13, 2011

(65) Prior Publication Data
US 2011/0242922 A1    Oct. 6, 2011

Related U.S. Application Data

(62) Division of application No. 12/345,835, filed on Dec. 30, 2008, now Pat. No. 7,983,095.

(30) Foreign Application Priority Data

Oct. 14, 2008 (KR) .................. 10-2008-0100550

(51) Int. Cl.
*G11C 7/10* (2006.01)
(52) U.S. Cl. ......... 365/189.05; 365/189.02; 365/189.16; 365/230.04
(58) Field of Classification Search ............. 365/189.02, 365/189.05, 189.16, 230.02, 230.04
See application file for complete search history.

(56) References Cited

U.S. PATENT DOCUMENTS

| | | | |
|---|---|---|---|
| 5,812,481 A | 9/1998 | Numata et al. | |
| 6,775,201 B2 | 8/2004 | Lee et al. | |
| 6,867,993 B2 | 3/2005 | Ohshima et al. | |
| 7,020,029 B2 * | 3/2006 | Lee | 365/189.05 |
| 7,099,175 B2 | 8/2006 | Lee et al. | |
| 7,212,449 B2 | 5/2007 | Lee | |
| 7,668,020 B2 * | 2/2010 | Kim | 365/189.05 |
| 7,839,709 B2 | 11/2010 | Kim et al. | |
| 2007/0237019 A1 | 10/2007 | Kwon | |

FOREIGN PATENT DOCUMENTS

| | | |
|---|---|---|
| JP | 07-211075 A | 8/1995 |
| KR | 1020050003529 A | 1/2005 |
| KR | 100549871 B1 | 1/2006 |

OTHER PUBLICATIONS

USPTO OA mailed Sep. 14, 2010 in connection with U.S. Appl. No. 12/345,835.
USPTO OA mailed Dec. 7, 2010 in connection with U.S. Appl. No. 12/345,835.
USPTO NOA mailed Mar. 11, 2011 in connection with U.S. Appl. No. 12/345,835.

* cited by examiner

*Primary Examiner* — Toan Le
(74) *Attorney, Agent, or Firm* — Ladas & Parry LLP

(57) ABSTRACT

A semiconductor memory apparatus includes a first data selection section inputted with the first data and second data and output one of the first data and the second data as first selection data in response to an address signal, a second data selection section inputted with the second data and the first selection data and output one of the second data and the first selection data as second selection data depending upon an input and output mode, and a data output section configured to be inputted with the first and second selection data and output first and second output data.

11 Claims, 8 Drawing Sheets

SEMICONDUCTOR MEMORY APPARATUS

CROSS-REFERENCES TO RELATED APPLICATION

The present application is a divisional of U.S. application Ser. No. 12/345,835, filed on Dec. 30, 2008, now U.S. Pat. No. 7,983,095, claims priority under 35 U.S.C. §119(a) to Korean application number 10-2008-0100550, filed on Oct. 14, 2008 in the Korean Intellectual Property Office, which is incorporated herein by reference in its entirety.

BACKGROUND

The present invention relates generally to a semiconductor memory apparatus, and more particularly, to the data input and output of a semiconductor memory apparatus.

Typically, in a semiconductor memory apparatus, the number of inputs and outputs varies depending upon an input and output mode. The input and output mode indicates the number of data which may be inputted and outputted by the semiconductor memory apparatus at a time. X4, X8 and X16 designate input and output modes. X4 means that a semiconductor memory apparatus may input and output f is a divisional of U.S. application number 12/345,835, filed on Dec. 30, 2008, now U.S. Pat. No. 7,983,095,our data at a time, X8 means that a semiconductor memory apparatus may input and output eight data at a time, and X16 means that a semiconductor memory apparatus may input and output sixteen data at a time. X4 and X8 are preferably adopted for servers and desktop computers, and X16 is preferably adopted for graphic applications and notebook computers.

Data transmission of semiconductor memory apparatuses is divided into single-ended signal transmission and differential signal transmission. The single-ended signal transmission has the number of channels for data transmission to be less than that of the differential signal transmission. That is, the semiconductor memory apparatuses adopted for the single-ended signal transmission may accomplish a high transmission rate from being able to use a decreased number of channels.

However, when the single-ended signal transmission is adopted, disadvantages occur, wherein a substantial amount of noise is generated. Also, and the increase of a data transmission rate greater than a predetermined level becomes difficult, because the bandwidth of the channels are typically limited by design.

To overcome the above problems generated by the single-ended signal transmission, the differential signal transmission is adopted. The differential signal transmission has its own problems caused by increasing the number of channels for data transmission. For example, when the number of differential signal transmission has twice as many transmission channels as the single-ended signal transmission the number of pads required are double for a chip. Therefore, the doubling of the pads causes the area of a semiconductor memory apparatus to increase. This increase of area on the chip from the increase pads does not accommodate the trend toward miniaturization of a semiconductor memory apparatus.

SUMMARY OF THE INVENTION

The present invention relates to a semiconductor memory apparatus which variably generates differential data and single-ended data based on a respective data input and output mode.

In one aspect of the present invention, a semiconductor memory apparatus includes a first data selection section configured to receive first data and second data and output one of the first data and the second data as first selection data in response to an address signal; a second data selection section configured to receive the second data and the first selection data and output one of the second data and the first selection data as second selection data depending upon an input and output mode; and a data output section configured to receive the first and second selection data and output first and second output data.

In another aspect of the present invention, a semiconductor memory apparatus includes a first data selection section configured to receive first through fourth data and output one of the first through fourth data as first selection data in response to a first address signal; a second data selection section configured to receive the second through fourth data and output one of the second through fourth data as second selection data in response to a second address signal; a third data selection section configured to receive the third data and the first selection data and output one of the third data and the first selection data as third selection data depending upon an input and output mode; a fourth data selection section configured to receive the fourth data and the second selection data and output one of the fourth data and the second selection data as fourth selection data depending upon the input and output mode; and a data output section configured to be activated depending upon the input and output mode, and be inputted with the first through fourth selection data and generate first through fourth output data.

In another aspect of the present invention, a semiconductor memory apparatus includes a data selection section configured to received first and second data and output one of the first and second data as first selection data in response to an address signal; a first lo data output section configured to receive the first selection data and generate first transmission data and first output data depending upon the first selection data; and a second data output section configured to receive the second data and the first transmission data and generate one of the second data and the first transmission data as is second output data depending upon an input and output mode.

In another aspect of the present invention, a semiconductor memory apparatus includes a first data selection section configured to receive first through fourth data and output one of the first through fourth data as first selection data in response to a first address signal; a second data selection section configured to receive the second through fourth data and output one of the second through fourth data as second selection data in response to a second address signal; a first data output section configured to be activated depending upon an input and output mode, and inputted with the first selection data and generate first transmission data and first output data; a second data output section configured to be activated depending upon the input and output mode, and inputted with the second selection data and generate second transmission data and second output data; a third data output section configured to be activated depending upon the input and output mode, and inputted with the third data and the first transmission data and output one of the third data and the first transmission data as third output data depending upon the input and output mode; and a fourth data output section configured to be activated depending upon the input and output mode, and inputted with the fourth data and the second transmission data and output one of the fourth data and the second transmission data as fourth output data depending upon the input and output mode.

BRIEF DESCRIPTION OF THE DRAWINGS

The above objects, and features and advantages will become more apparent after a reading of the following detailed description taken in conjunction with the drawings, in which.

DETAILED DESCRIPTION

Figure 1:
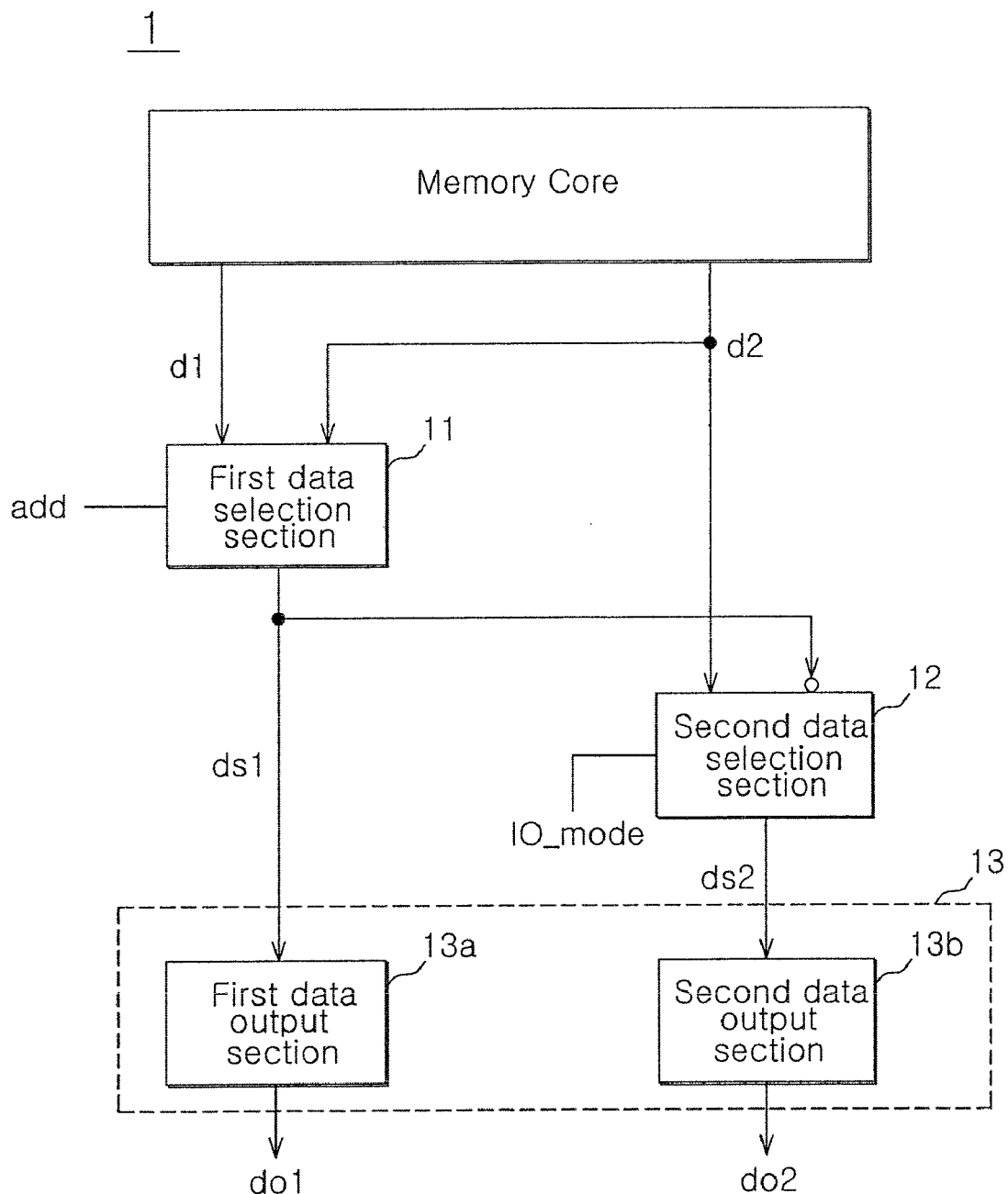
FIG. 1 is a schematic view showing the configuration of a semiconductor memory apparatus according to a first embodiment.

FIG. 1 is a schematic view showing the configuration of a semiconductor memory apparatus according to a first embodiment. The semiconductor memory apparatus 1 according to the first embodiment may include first and second data selection sections 11 and 12 and a data output section 13. The first data selection section 11 may be inputted with first and second data 'd1' and 'd2' and output first selection data 'ds1' in response to an address signal 'add'. The second data selection section 12 can be inputted with the second data 'd2' and the first selection data 'ds1'. The second data selection section 2 can output second selection data 'ds2' in response to an input and output mode signal 'IO_mode'.

The input and output modes of semiconductor memory apparatuses indicate the numbers of data which may be inputted and outputted by the semiconductor memory apparatuses at a time. Typically, input and output modes, X4, X8 and X16 modes are used. The X4 mode may input and output four data at a time, the X8 mode may input and output eight data at a time, and the X16 mode may input and output sixteen data at a time.

The second data selection section 12 may output the second data 'd2' as the second selection data 'ds2' or the data obtained by inverting the first selection data 'ds1' as the second selection data 'ds2' in response to the input and output mode signal 'IO_mode' inputted depending upon an input and output mode. For example, when the input and output mode is a first input and output mode, the second data selection section 12 may output the data obtained by is inverting the first selection data 'ds1' as the second selection data 'ds2'. When the input and output mode is a second input and output mode, the second data selection section 12 may output the second data 'd2' as the second selection data 'ds2'. In the embodiment, the first input and output mode may correspond to the X4 mode, and the second input and output mode can correspond to the X8 mode. Additionally, the embodiment is not limited thereto, and the second input and output mode corresponds to an input and output mode that may input and output double data at a time when compared to the first input and output mode. The input and output mode signal 'IO_mode' may be inputted while having a different logic level depending upon an input and output mode. For example, a signal having a low level can be inputted as the input and output mode signal 'IO_mode' in the first input and output mode, and a signal having a high level may be inputted as the input and output mode signal 'IO_mode' in the second input and output mode.

The first and second data selection sections 11 and 12 may include muxes i.e. multiplexers which respectively use the address signal 'add' and the input and output mode signal 'IO_mode' as a control signal.

The data output section 13 may be configured to be inputted with the first and second selection data 'ds1' and 'ds2' and generate first and second output data 'do1' and 'do2'. The data output section 13 may include a first data output section 13a and a second data output section 13b.

The first data output section 13a may generate the first output data 'do1' in response to the first selection data 'ds1' inputted thereto, and the second data output section 13b may generate the second output data 'do2' in response to the second selection data. 'ds2' inputted thereto. The respective first and second data output sections 13a and 13b may be inputted with the first and second selection data 'ds1' and 'ds2' applied in parallel and may generate the first and second output data 'do1.' and 'do2' to be outputted in series. The first and second data output sections 13a and 13b may be realized as in the conventional art.

The operations of the semiconductor memory apparatus 1 according to the first embodiment will be described below. The first data selection section 11 is inputted with the first and second data 'd1' and 'd2' through a memory core. The first data selection section 11 outputs one of the first and second data 'd1' and 'd2' as the first selection data 'ds1' in response to the address signal 'add' inputted thereto. The address signal 'add' may be inputted to allow the first data selection section 11 to output one of the first and second data 'd1' and 'd2' as the first selection data 'ds1' in the first input and output mode or the first data 'd1' as the first selection data 'ds1' in the second input and output mode. The first data output section 13a is inputted with the first selection data and generates the first output data 'do1'.

The second data selection section 12 is inputted with the second data 'd2' and the first selection data 'ds1'. The second data selection section 12 outputs the data obtained by inverting the first selection data 'ds1' as the second selection data 'ds2' in response to the input and output mode signal 'IO_mode' in the first input and output mode, or the second data 'd2' as the second selection data 'ds2' in response to the input and output mode signal 'IO_mode' in the second input and output mode. The second selection data 'ds2' is inputted to the second data output section 13b. The second data output section 13b is inputted with the second selection data 'ds2' and generates the second output data 'do2'.

Accordingly, in the first embodiment, when the semiconductor memory apparatus 1 operates in the first input and output mode, the first output data 'do1' outputted by the first data output section 13a and the second output data 'do2' outputted by the second data output section 13b have opposite phases. For example, if the first output data 'do1' has a high level, the second output data 'do2' has a low level. When the semiconductor memory apparatus 1 operates in the second input and output mode, the first and second output data 'do1' and 'do2' vary depending upon the first and second data 'd1' and 'd2', respectively.

That is, the semiconductor memory apparatus 1 according to the first embodiment may output differential data or single-ended data depending upon an input and output mode.

Figure 2:
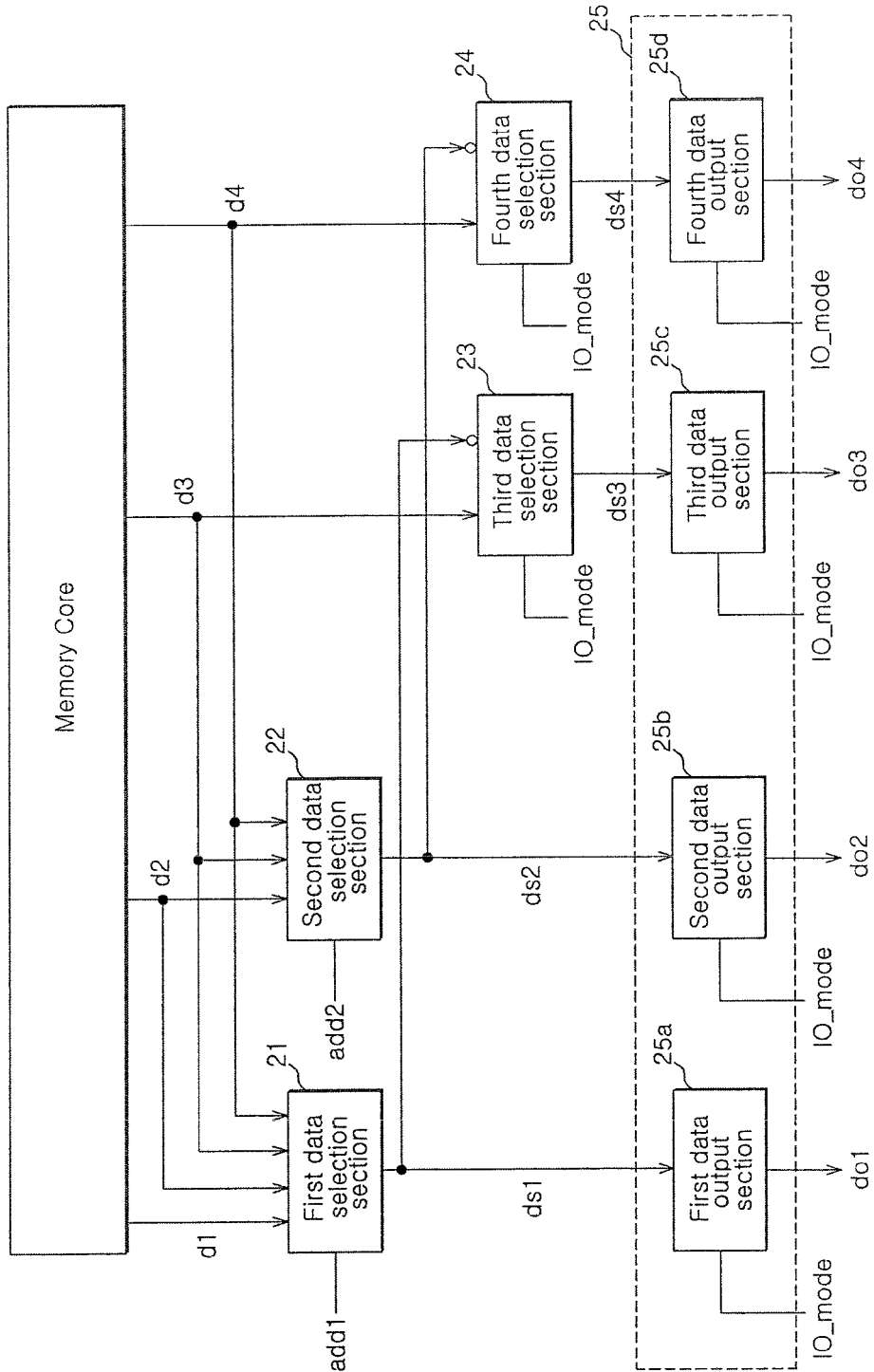
FIG. 2 is a schematic view showing the configuration of a semiconductor memory apparatus according to a second embodiment.

FIG. 2 is a schematic view showing the configuration of a semiconductor memory apparatus according to a second embodiment. The semiconductor memory apparatus 2 according to the second embodiment may include first through fourth data selection sections 21 through 24 and a data output section 25. The first data selection section 21 may be inputted with first through fourth data 'd1' through 'd4' and output first selection data 'ds1.' in response to a first address signal 'add1'. The second data selection section 22 may be inputted with the second through fourth data 'd2' through 'd4' and output second selection data 'ds2' in response to a second address signal 'add2'.

The third data selection section 23 may be inputted with the third data 'd3' and the first selection data 'ds1' and output one of the third data 'd3' and the first selection data 'ds1' as third selection data 'ds3' depending upon an input and output mode. For example, the third data selection section 23 may be inputted with an input and output mode signal 'IO_mode' and output the data obtained by inverting the first selection data 'ds1' as the third selection data 'ds3' in a first input and output mode, may be inputted with an input and output mode signal 'IO_mode' and output the data obtained by inverting the first selection data as the third selection data 'ds3' in a second input and output mode, and may be inputted with an input and output mode signal 'IO_mode' and output the third data 'd3' as the third selection data 'ds3' in a third input and output mode. This embodiment is not limited to the first through third input and output modes being X4, X8 and X16 modes, respectively. This embodiment may have an input and output mode signal 'IO_mode' wherein the combination of signals may be provide that have different logic levels for the respective input and output modes.

The fourth data selection section 24 may be inputted with the fourth data 'd4' and the second selection data 'ds2' and output one of the fourth data 'd4' and the data obtained by inverting the second selection data 'ds2' as fourth selection data 'ds4' depending upon the input and output mode signal 'IO_mode'. For example, the fourth data selection section 24 may be inputted with the input and output mode signal 'IO_mode' and output the data obtained by inverting the second selection data 'ds2' as the fourth selection data 'ds4' in the second input and output mode, and may be inputted with the input and output mode signal 'IO_mode' and output the fourth data 'd4' as the fourth selection data 'ds4' in the third input and output mode.

The first and second data selection sections 21 and 22 may comprise muxes which respectively use the first and second address signals 'add1' and 'add2' as a control signal, and the third and fourth data selection sections 23 and 24 may comprise muxes which respectively use the input and output mode signal 'IO_mode' as a control signal.

The data output section 25 may be determined in response to the input and output mode signal 'IO_mode' whether to be activated or not. The data output section 25 may be inputted with the first through fourth selection data 'ds1' through 'ds4' and generate first through fourth output data 'do1' through 'do4'. The data output section 25 may include first through fourth data output sections 25a through 25d.

The first through fourth data output sections 25a through 25d may be determined to be activated in response to the input and output mode signal 'IO_mode'. For example, in the first input and output mode, the first and third data output sections 25a and 25c may be activated by receiving the input and output mode signal 'IO_mode', and in the second and third input and output modes, all of the first through fourth data output sections 25a through 25d may be activated by receiving the input and output mode signal 'IO_mode'. The first through fourth data output sections 25a through 25d may be activated in response to the input and output mode signal 'IO_mode' and generate first through fourth output data 'do1' through 'do4' by receiving the first through fourth selection data 'ds1' through 'ds4'.

The first through fourth data output sections 25a through 25d may be inputted with the first through fourth selection data 'ds1' through 'ds4' applied in parallel and may generate the first through fourth output data 'do1.' through 'do4' to be outputted in series. The first through fourth data output sections 25a through 25d may be realized as in the conventional art.

The operations of the semiconductor memory apparatus 2 according to the second embodiment will be described below. First, when the semiconductor memory apparatus 2 operates in the first input and output mode, the first data selection section 21 may output one of the first through fourth data 'd1' through 'd4' as the first selection data 'ds1' in response to the first address signal 'add1'. The first selection data 'ds1' outputted from the first data selection section 21 is inputted to the first data output section 25a and the third data selection section 23. The first data output section 25a generates the first output data 'do1' depending upon the level of the first selection data 'ds1', and the third data selection section 23 is inputted with the input and output mode signal 'IO_mode' and outputs the data obtained by inverting the first selection data 'ds1' inputted thereto as the third selection data 'ds3'. The third data output section 25c is activated in response to the input and output mode signal 'IO_mode' and generates the third output data 'do3' depending upon the level of the third selection data 'ds3'. Accordingly, when the semiconductor memory apparatus 2 operates in the first input and output mode, the first and third output data 'do1' and 'do3' are generated. The first and third output data 'do1' and 'do3' constitute a pair of differential data which have opposite phases.

If the semiconductor memory apparatus 2 operates in the second input and output mode, the first address signal 'add1' is inputted to allow the first data selection section 21 to output one of the first through fourth data 'd1' through 'd4' as the first selection data 'ds1', and the second address signal 'add2' is inputted to allow the second data selection section 22 to output the data next to the data selected by the first data selection section 21 as the second selection data 'ds2'. For example, if the first data selection section 21 outputs the first data 'd1' as the first selection data 'ds1' in response to the first address signal 'add1', the second data selection section 22 may output the second data 'd2' as the second selection data 'ds2' in response to the second address signal 'add2'.

The first selection data 'ds1' outputted from the first data selection section 21 is inputted to the first data output section 25a and the third data selection section 23, and the second selection data 'ds2' outputted from the second data selection section 22 is inputted to the second data output section 25b and the fourth data selection section 24. The third data selection section 23 inputted with the third data 'd3' and the first selection data 'ds1' outputs the data obtained by inverting the first selection data 'ds1' as the third selection data 'ds3' in response to the input and output mode signal 'IO_mode', and the fourth data selection section 24 inputted with the fourth data 'd4' and the second selection data 'ds2' outputs the data obtained by inverting the second selection data 'ds2' as the fourth selection data 'ds4' in response to the input and output mode signal 'IO_mode'. All of the first through fourth data output sections 25a through 25d, which are inputted with the input and output mode signal 'IO_mode', are activated and generate the first through fourth output data 'do1' through 'do4' depending upon the first through fourth selection data 'ds1' through 'ds4', respectively. Accordingly, the first output data 'do1' and the third output data 'do3' constitute one pair of differential data which have opposite phases, and the second output data 'do2' and the fourth output data 'do4' constitute the other pair of differential data which have opposite phases. That is, in the second input and output mode, the semiconductor memory apparatus 2 according to the second embodiment generates two pairs of differential data.

Finally, when the semiconductor memory apparatus 2 operates in the third input and output mode, the first address signal 'add1' is inputted to allow the first data selection section 21 to output the first data 'd1' as the first selection data 'ds1', and the second address signal 'add2' is inputted to allow the second data selection section 22 to output the second data 'd2' as the second selection data 'ds2'. The first through fourth data selection sections 21 through 24 respectively output the first through fourth data 'd1' through 'd4' as the first through fourth selection data 'ds1' through 'ds4'. All of the first through fourth data output sections 25a through 25d are activated and generate the first through fourth output data 'do1' through 'do4' depending upon the levels of the first through fourth data 'd1' through 'd4', respectively. Thus, four single-ended data are generated.

It is to be appreciated that the semiconductor memory apparatus 2 according to the second embodiment may generate one pair of differential data in the first input and output mode, two pairs of differential data in the second input and output mode, and four single-ended data in the third input and output mode.

Figure 3:
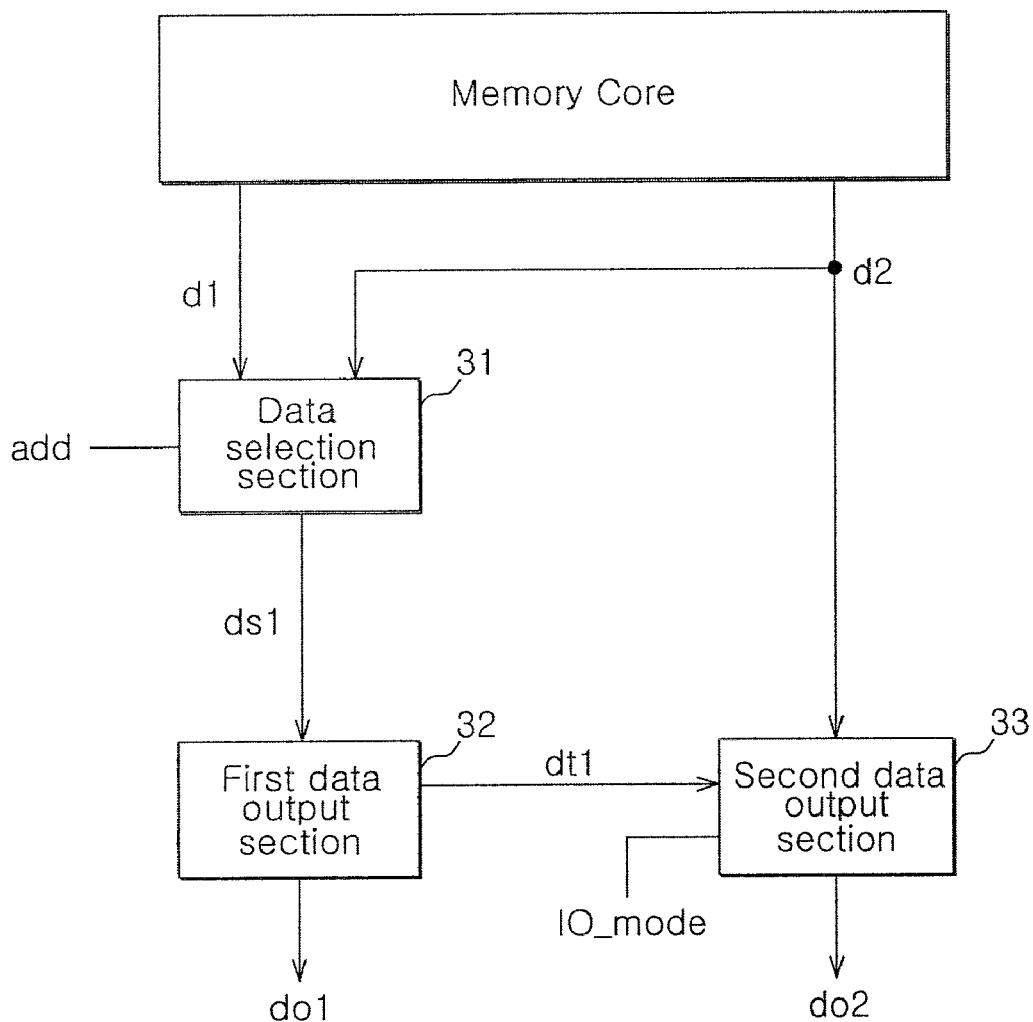
FIG. 3 is a schematic view showing the configuration of a semiconductor memory apparatus according to a third embodiment.

FIG. 3 is a schematic view showing the configuration of a semiconductor memory apparatus according to a third embodiment. The semiconductor memory apparatus 3 according to the third embodiment may include a data selection section 31, a first data output section 32 and a second data output section 33. The data selection section 31 may be inputted with first and second data 'd1' and 'd2' and output first selection data 'ds1' in response to an address signal 'add'.

The first data output section 32 may be inputted with the first selection data 'ds1' and generate first transmission data 'dt1' and first output data 'do1'. The first data output section 32 applies the first transmission data 'dt1' to the second data output section 33. The first data output section 32 may be inputted with the first selection data 'ds1' applied in parallel and may generate the first transmission data 'dt1' and the first output data 'do1' to be outputted in series.

The second data output section 33 may be inputted with the second data 'd2' and the first transmission data 'dt1' and generate the second output data 'do2' in response to an input and output mode signal 'IO_mode'. The second data output section 33 may be inputted with the input and output mode signal 'IO_mode' and generate the second output data 'do2' according to the data obtained by inverting the first transmission data 'dt1' in a first input and output mode, and may be inputted with the input and output mode signal 'IO_mode' and generate the second output data 'do2' according to the second data 'd2' in a second input and output mode. The second data output section 33 may be inputted with the second data 'd2' applied in parallel and the first transmission data 'dt1' applied in series and may generate the second output data 'do2' to be outputted in series. The first data output section 32 may be configured as in the conventional art, and the second data output section 33 may be configured, for example, by adding to the conventional art a mux for outputting one of the second data 'd2' and the data obtained by inverting the first transmission data 'dt1' in response to the input and output mode signal 'IO_mode' as a control signal.

The operations of the semiconductor memory apparatus 3 according to the third embodiment will be described below. In the first input and output mode, the data selection section 31 outputs one of the first and second data 'd1' and 'd2' as the first selection data 'ds1' in response to the address signal 'add'. The first selection data 'ds1' is inputted to the first data output section 32. The first data output section 32 generates the first transmission data 'dt1' and the first output data 'do1' according to the first selection data 'ds1' and applies the first transmission data 'dt1' to the second data output section 33. When the semiconductor memory apparatus 3 operates in the first input and output mode and the input and output mode signal 'IO_mode' is inputted, the second data output section 33 inputted with the second data 'd2' and the first transmission data 'dt1' generates the second output data 'do2' according to the data obtained by inverting the first transmission data 'dt1'. Hence, the first and second output data 'do1' and 'do2', which are generated by the first and second data output sections 32 and 33, constitute a pair of differential data which have opposite phases.

When the semiconductor memory apparatus 3 operates in a second input and output mode and the input and output mode signal 'IO_mode' is inputted, the second data output section 33 generates the second output data 'do2' according to the second data 'd2'. Accordingly, two single-ended data are generated. That is to say, the semiconductor memory apparatus 3 according to the third embodiment may generate a pair of differential data in the first input and output mode and two single-ended data in the second input and output mode.

Figure 4:
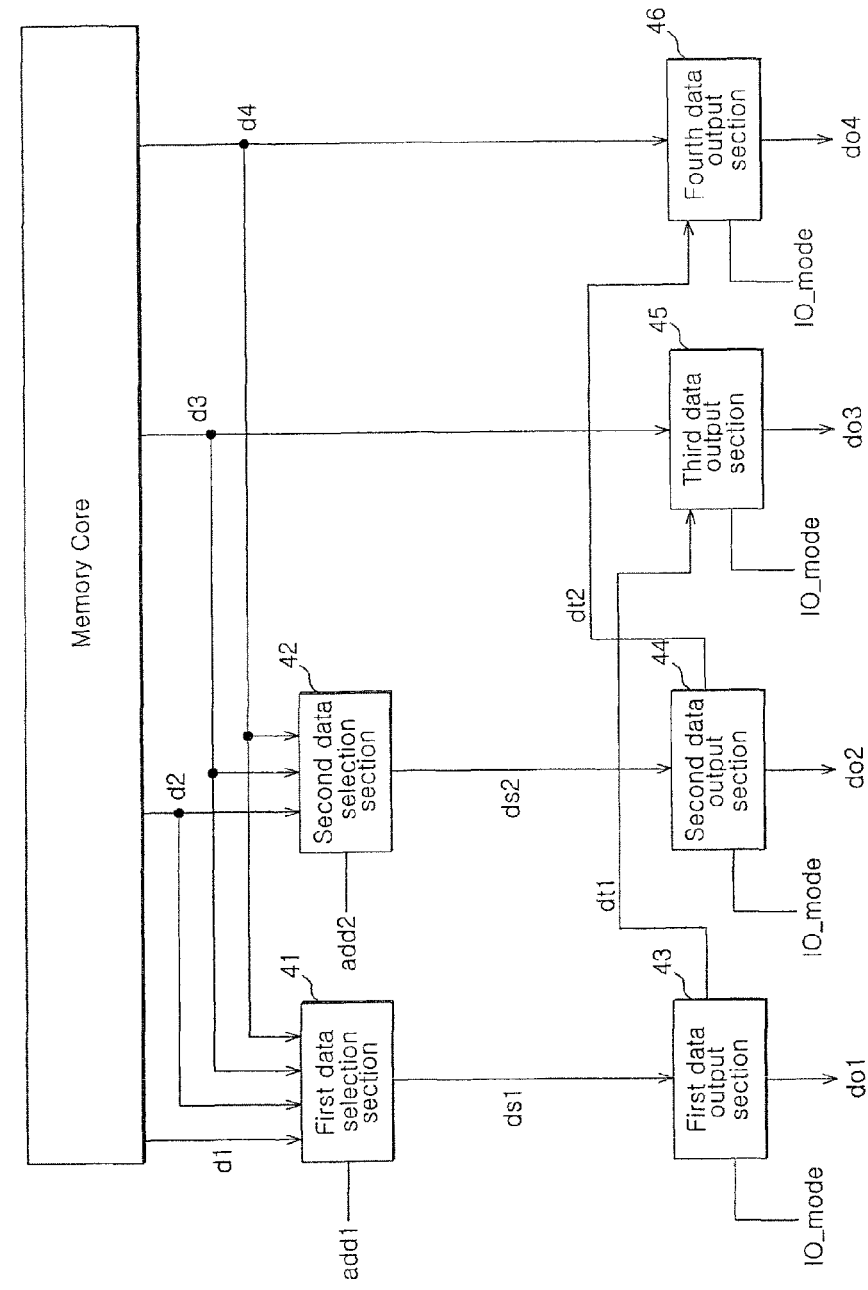
FIG. 4 is a schematic view showing the configuration of a semiconductor memory apparatus according to a fourth embodiment.

FIG. 4 is a schematic view showing the configuration of a semiconductor memory apparatus according to a fourth embodiment. The semiconductor memory apparatus according to the fourth embodiment may include first and second data selection sections 41 and 42 and first through fourth data output sections 43 through 46. The first data selection section 41 may be inputted with first through fourth data 'd1' through 'd4' and output one of the first through fourth data 'd1' through 'd4' as first selection data 'ds1' in response to a first address signal 'add1'. The second data selection section 42 may be inputted with second through fourth data 'd2' through 'd4' to and output one of the second through fourth data 'd2' through 'd4' as second selection data 'ds2' in response to a second address signal 'add2'.

The first data output section 43 may be activated depending upon an input and output mode, be inputted with the first selection data 'ds1', and generate first transmission data 'dt1' and first output data 'do1'. The first data output section 43 may apply the first transmission data 'dt1' to the third data output section 45. The first data output section 43 may be inputted with the first selection data 'ds1' applied in parallel and generate the first transmission data 'dt1' and the first output data 'do1' to be outputted in series.

The second data output section 44 may also be activated depending upon an input and output mode, be inputted with the second selection data 'ds2', and generate second transmission data 'dt2' and second output data 'do2'. The second data output section 44 may apply the second transmission data 'dt2' to the fourth data output section 46. The second data output section 44 may be inputted with the second selection data 'ds2' applied in parallel and generate the second transmission data 'dt2' and the second output data 'do2' to be outputted in series.

The third and fourth data output sections 45 and 46 may be activated, in response to an input and output mode signal 'IO_mode' inputted depending on an input and output mode. The third data output section 45 may be inputted with the first transmission data 'dt1' and the third data 'd3' and generate the third output data 'do3' to according to one of the data obtained by inverting the first transmission data 'dt1' and the third data 'd3' in response to the input and output mode signal 'IO_mode'. For example, the third data output section 45 may generate the third output data 'do3' according to the data obtained by inverting the first transmission data 'dt1' in is first and second input and output modes. Also, the third data output section 45 may generate the third output data 'do3' according to the third data 'd3' in a third input and output mode. The third data output section 45 may be inputted with the third data 'd3' applied in parallel and the first transmission data 'dt1' applied in series and may generate the third output data 'do3' to be outputted in series.

The fourth data output section 46 may be inputted with the second transmission data 'dt2' and the fourth data 'd4' and generate the fourth output data 'do4' according to one of the data obtained by inverting the second transmission data 'dt2' and the fourth data 'd4' in response to the input and output mode signal 'IO_mode'. For example, the fourth data output section 46 may generate the fourth output data 'do4' according to the data obtained by inverting the second transmission data 'dt2' in the second input and output mode. Also, the fourth data output section 46 may generate the fourth output data 'do4' according to the fourth data 'd4' in the third input and output mode. The fourth data output section 46 may be inputted with the fourth data 'd4' applied in parallel and the second transmission data 'dt2' applied in series and may generate the fourth output data 'do4' to be outputted in series.

The operations of the semiconductor memory apparatus 4 according to the fourth embodiment will be described below. When the semiconductor memory apparatus 4 operates in the first input and output mode, the first data selection section 41 outputs one of the first through fourth data 'd1' through 'd4' as the first selection data 'ds1' in response to the first address signal 'add1', and the second data selection section 42 outputs the data next to the data selected by the first data selection section 41 among the second through fourth data 'd2' through 'd4' as the second selection data 'ds2' in response to the second address signal 'add2'. For example, in the case where the first data selection section 41 outputs the first data 'd1' as the first selection data 'ds1' in response to the first address signal 'add1', the second data selection section 42 may output the second data 'd2' as the second selection data 'ds2' in response to the second address signal 'add2'. In the first input and output mode, if the input and output mode signal 'IO_mode' is inputted, the first and third data output sections 43 and 45 are activated, and the second and fourth data output sections 44 and 46 are inactivated. The first data output section 43 is inputted with the first selection data 'ds1' and generates the first transmission data 'dt1' and the first output data 'do1'. The third data output section 45 is inputted with the first transmission data 'dt1' applied from the first data output section 43 and the third data 'd3' and generates the third output data 'do3' according to the data obtained by inverting the first transmission data 'dt1'. Accordingly, in the first input and output mode, the semiconductor memory apparatus 4 according to the fourth embodiment may generate a pair of differential data which have opposite phases.

When the semiconductor memory apparatus 4 operates in the second input and output mode, the first and second data selection sections 41 and 42 output the first and second data 'd1' and 'd2' as the first and second selection data 'ds1' and 'ds2' in response to the first and second address signals 'add1' and 'add2'. In the second input and output mode, all of the first through fourth data output sections 43, 44, 45 and 46 are activated by receiving the input and output mode signal 'IO_mode'. The first data output section 43 generates the first output data 'do1' according to the first selection data 'ds1' and applies the first transmission data 'dt1' generated according to the first selection data 'ds1' to the third data output section 45. The second data output section 44 generates the second output data 'do2' according to the second selection data 'ds2' and applies the second transmission data 'dt2' generated according to the second selection data 'ds2' to the fourth data output section 46. The third data output section 45 is inputted with the third data 'd3' and the first transmission data 'dt1' and generates the third output data 'do3' according to the data obtained by inverting the first transmission data The fourth data output section 46 is inputted with the fourth data 'd4' and the second transmission data 'dt2' and generates the fourth output data 'do4' according to the data obtained by inverting the second transmission data 'dt2'. Accordingly, in the second input and output mode, two pairs of differential data are generated. That is to say, the first and third output data 'do1' and 'do3' constitute one pair of differential data which have opposite phases, and the second and fourth output data 'do1' and 'do4' constitute the other pair of differential data which have opposite is phases.

When the semiconductor memory apparatus operates in the third input and output mode, all of the first through fourth data output sections 43 through 46 are activated by receiving the input and output mode signal 'IO_mode'. The first and second data output sections 43 and 44 are inputted with the first and second selection data 'ds1' and 'ds2' and generate the first and second output data 'do1' and 'do2'. The third data output section 45 generates the third output data 'do3' according to the third data 'd3'. The fourth data output section 46 generates the fourth output data 'do4' according to the fourth data 'd4'. Accordingly, four single-ended data are generated.

Therefore, the semiconductor memory apparatus according to the embodiment may be inputted with the input and output mode signal 'IO_mode' depending upon the input and output mode thereof, and generate differential data or single-ended data.

Figure 5:
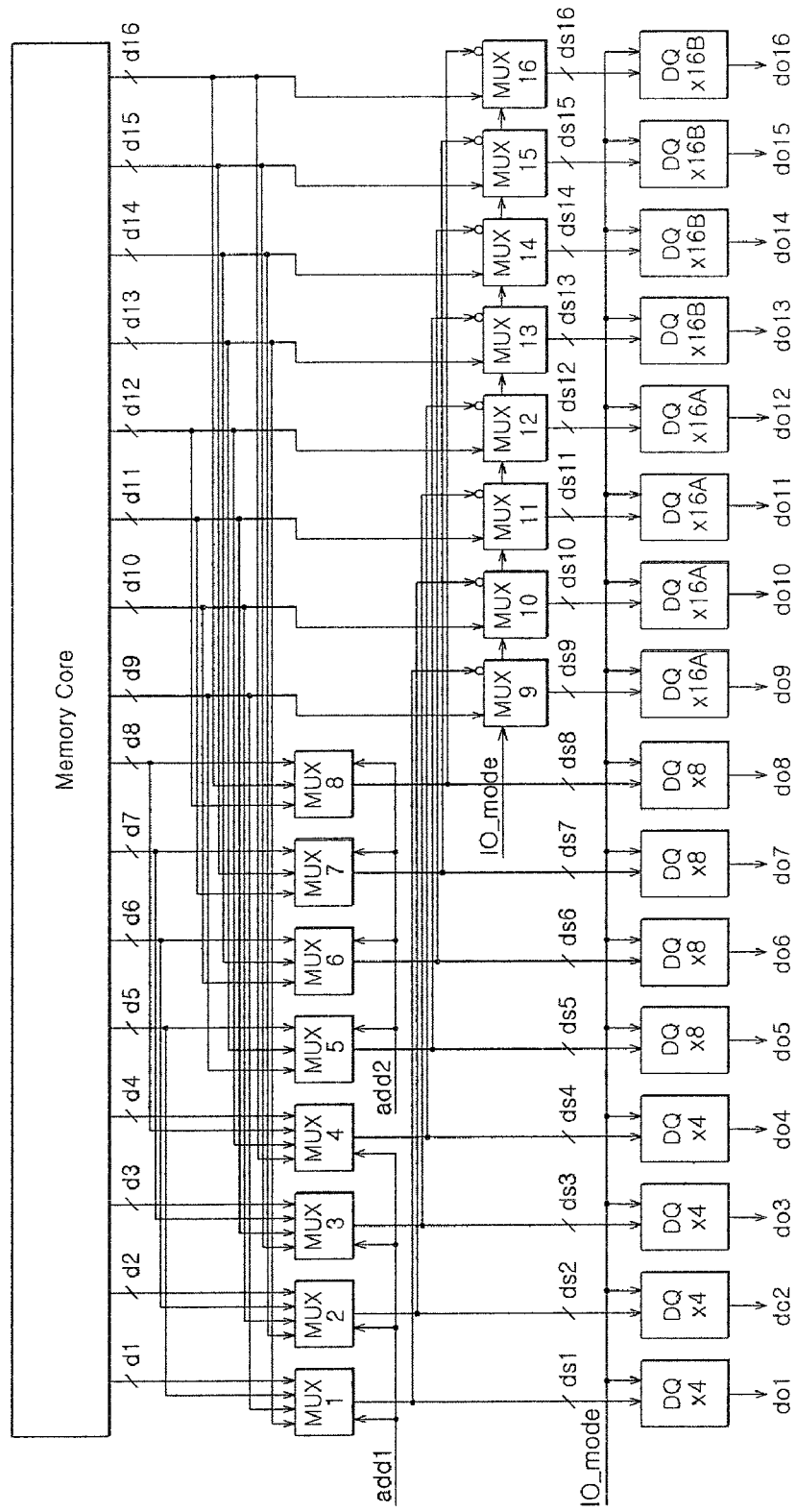
FIG. 5 is a schematic view showing an exemplary semiconductor memory apparatus to which the second embodiment is applied.

FIG. 5 is a schematic view showing an exemplary semiconductor memory apparatus to which the second embodiment is applied.

Referring to FIG. 5, first through fourth muxes MUX1 through MUX4 correspond to the first data selection section 21 of FIG. 2, fifth through eighth muxes MUX5 through MUX8 correspond to the second data selection section 22 of FIG. 2, ninth through twelfth muxes MUX9 through MUX12 correspond to the third data selection section 23 of FIG. 2, and thirteenth through sixteenth muxes MUX13 through MUX16 correspond to the fourth data selection section 24 of FIG. 2. Also, DQ X4 blocks correspond to the first data output section 25 of FIG. 2, DQ X8 blocks correspond to the second data output section 26 of FIG. 2, and DQ X16A and DQ X16B blocks respectively correspond to the third and fourth data output sections 27 and 28 of FIG. 2. The first data 'd1' of FIG. 2 corresponds to first through fourth data 'd1' through 'd4' of FIG. 5. Since X4 indicates a mode that may input and output four data at a time, the first through fourth data d1 through d4 are illustrated in FIG. 5. Each of data 'd1' through 'd16' is composed of 8 bits. Semiconductor memory apparatuses perform a prefetch operation in order to increase an operation speed, and 4-bit prefetch and 8-bit prefetch are typically used. This embodiment in not limited to the semiconductor memory apparatus that uses an 8-bit prefetch. The second data 'd2' of FIG. 2 corresponds to fifth through eighth data 'd5' through 'd8', and the third and fourth data 'd3' and 'd4' of FIG. 2 correspond to ninth through twelfth data 'd9' through 'd12' and thirteenth through sixteenth data 'd13' through 'd16'.

Figure 6:
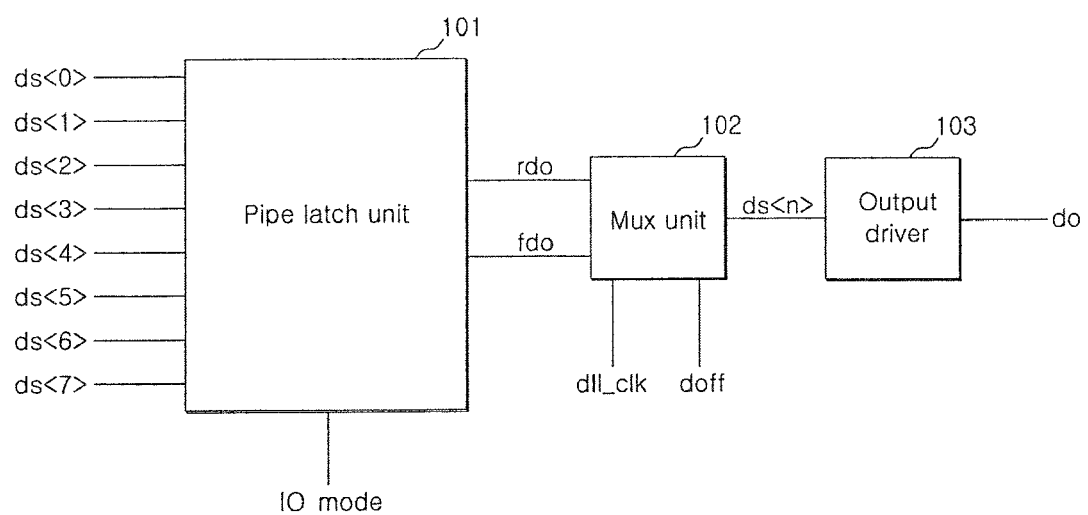
FIG. 6 is a schematic view showing the configuration of the DQ blocks shown in FIG. 5.

FIG. 6 is a schematic view showing the configuration of the DQ blocks DQ X4, DQ X8, DQ X16A and DQX 16B shown in FIG. 5. The DQ blocks DQ X4, DQ X8, DQ X16A and DQX 16B shown in FIG. 5 have the same configuration, and therefore, only one DQ block is shown in FIG. 6.

In FIG. 6, the DQ block may be composed of a pipe latch unit 101, a mux unit 102 and an output driver 103. The pipe latch unit 101 may be configured to store 8-bit selection data 'ds<0:7>' inputted in parallel and output sequentially the 8-bit selection data 'ds<0:7>'. The pipe latch unit 101 is activated, in response to the input and output mode signal 'IO_mode', and outputs the selection data 'ds<0:7>' inputted in parallel by dividing them into rising data 'rdo' and falling data 'fdo'. For example, even-numbered selection data 'ds<0>', 'ds<2>', 'ds<4>' and 'ds<6>' may constitute the rising data 'rdo', and odd-numbered selection data 'ds<1>', 'ds<3>', 'ds<5>' and 'ds<7>' may constitute the falling data 'fdo'. The mux unit 102 may output one of the rising data 'rdo' and the falling data 'fdo' as selection data 'ds<n>' in response to a DLL clock signal 'dll_clk' and a driver-off signal 'doff'. The DLL clock signal 'dll_clk' is a clock signal that is generated by a delay locked loop (DLL) circuit in a semiconductor memory apparatus and is synchronized with the external clock signal inputted to the semiconductor memory apparatus. The driver-off signal 'doff' is a signal that may be enabled when the semiconductor memory apparatus is in a standby state and may inactivate the mux unit 102, wherein the mux unit 102 does not output data.

The output driver 103 may be inputted with the output 'ds<n>' of the mux unit 102 and generate output data 'do'. The output data 'do' is transmitted to the data pad provided to the semiconductor memory apparatus. The DQ block having the above-described configuration may be realized as in the conventional art.

The operations of the semiconductor memory apparatus shown in FIG. 5 will be described with reference to FIGS. 5 and 6. In the first input and output mode, in response to the input and output mode signal 'IO_mode', the DQ X4 blocks and the DQ X16A blocks are activated, and the DQ X8 blocks and the DQ X16B blocks are inactivated. The following explanation is given for an embodiment aspect, in which, in response to the first address signal 'add1', the first mux MUX1 outputs the first data 'd1' as the first selection data 'ds1' and the second through fourth muxes MUX2 through MUX4 respectively output the second through fourth data 'd2' through 'd4' as the second through fourth selection data 'ds2' through 'ds4'. In response to the input and output mode signal 'IO_mode', the ninth through twelfth muxes MUX9 through MUX12 are inputted with the ninth through twelfth data 'd9' through 'd12' and the first through fourth selection data 'ds1' through 'ds4' and output the data obtained by inverting the first through fourth selection data 'ds1' through 'ds4' as the ninth through twelfth selection data 'ds9' through 'ds12'.

The DQ X4 blocks are respectively inputted with the first through fourth selection data 'ds1' through 'ds4' and generate the first through fourth output data 'do1' through 'do4' according to the first through fourth selection data 'ds1' through 'ds4', and the DQ X16A blocks are respectively inputted with the data obtained by inverting the first through fourth selection data 'ds1' through 'ds4' and generate the ninth through twelfth output data 'do9' through 'do12'. Accordingly, four pairs of differential data are generated. That is, the first output data 'do1' and the ninth output data 'do9', the second output data 'do1' and the tenth output data 'do10', the third output data 'do3' and the eleventh output data 'do11', and the fourth output data 'do4' and the twelfth output data 'do12' constitute the four respective pairs of differential data.

In the second input and output mode, all the DQ blocks are activated in response to the input and output mode signal 'IO_mode'.

The following explanation is given for an embodiment aspect, in which the first through fourth muxes MUX1 through MUX4 respectively output the first through fourth data 'd1' through 'd4' as the first through fourth selection data 'ds1' through 'ds4' in response to the first address signal 'add1' and the fifth through eighth muxes MUX5 through MUX8 respectively output the fifth through eighth data 'd5' through 'd8' as the fifth through eighth selection data 'ds5' through 'ds8' in response to the second address signal 'add2'. In response to the input and output mode signal 'IO_mode', the ninth through twelfth muxes_MUX9 through MUX12 are respectively inputted with the first through fourth selection data 'ds1' through 'ds4' applied from the first through fourth muxes MUX1 through MUX4 and respectively output the data obtained by inverting the first through fourth selection data 'ds1' through 'ds4' as the ninth through twelfth selection data 'ds9' through 'ds12'. In response to the input and output mode signal 'IO_mode', the thirteen through sixteenth muxes MUX13 through MUX16 are respectively inputted with the fifth through eighth selection data 'ds5' through 'ds8' applied from the fifth through eighth muxes MUX5 through MUX8 and respectively is output the data obtained by inverting the fifth through eighth selection data 'ds5' through 'ds8' as the thirteenth through sixteenth selection data 'ds13' through 'ds16'.

The DQ X4 blocks are respectively inputted with the first through fourth selection data 'ds1' through 'ds4' and respectively generate the first through fourth output data 'do1' through 'do4' according to the logic levels of the first through fourth selection data 'ds1<n>' through 'ds4<n>' synchronized with the DLL clock signal 'dll_clk'. The DQ X8 blocks are respectively inputted with the fifth through eighth selection data 'ds5' through 'ds8' and respectively generate the fifth through eighth output data 'do5' through 'do8' according to the logic levels of the fifth through eighth selection data 'ds5<n>' through 'ds8<n>' synchronized with the DLL clock signal 'dll_clk'.

The DQ X16A blocks are respectively inputted with the ninth through twelfth selection data 'ds9' through 'ds12' and respectively generate the ninth through twelfth output data 'do9' through 'do12' according to the logic levels of the ninth through twelfth selection data 'ds9<n>' through 'ds12<n>' synchronized with the DLL clock signal 'dll_clk'. The DQ X16B blocks are respectively inputted with m the thirteenth through sixteenth selection data 'ds13' through 'ds16' and respectively generate the thirteenth through sixteenth output data 'do13' through 'do16' according to the logic levels of the thirteenth through sixteenth selection data 'ds13<n>' through 'ds16<n>' synchronized with the DLL clock signal 'dll_clk'.

Accordingly, the first through fourth output data 'do1' through 'do4' and the ninth through twelfth output data 'dog' through 'do12' constitute four pairs of differential data, and the fifth through eighth output data 'do5' through 'do8' and the thirteenth through sixteenth output data 'do13' through 'do16' constitute four pairs of differential data. Therefore, eight pairs of differential data may be generated.

In the third input and output mode, all the DQ blocks are activated in response to the input and output mode signal 'IO_mode'. The first through sixteenth muxes MUX1 through MUX16 are inputted with the first through sixteenth data 'd1' through 'd16' and output the first through sixteenth selection data 'ds1' through 'ds16'. The DQ X4 blocks, the DQ X8 blocks, the DQ X16A blocks and the DQ X168 blocks are inputted with the first through sixteenth selection data 'ds1' through 'ds16' and output the first through sixteenth output data 'do1' through 'do16', respectively. Accordingly, sixteen single-ended data may be generated.

Figure 7:
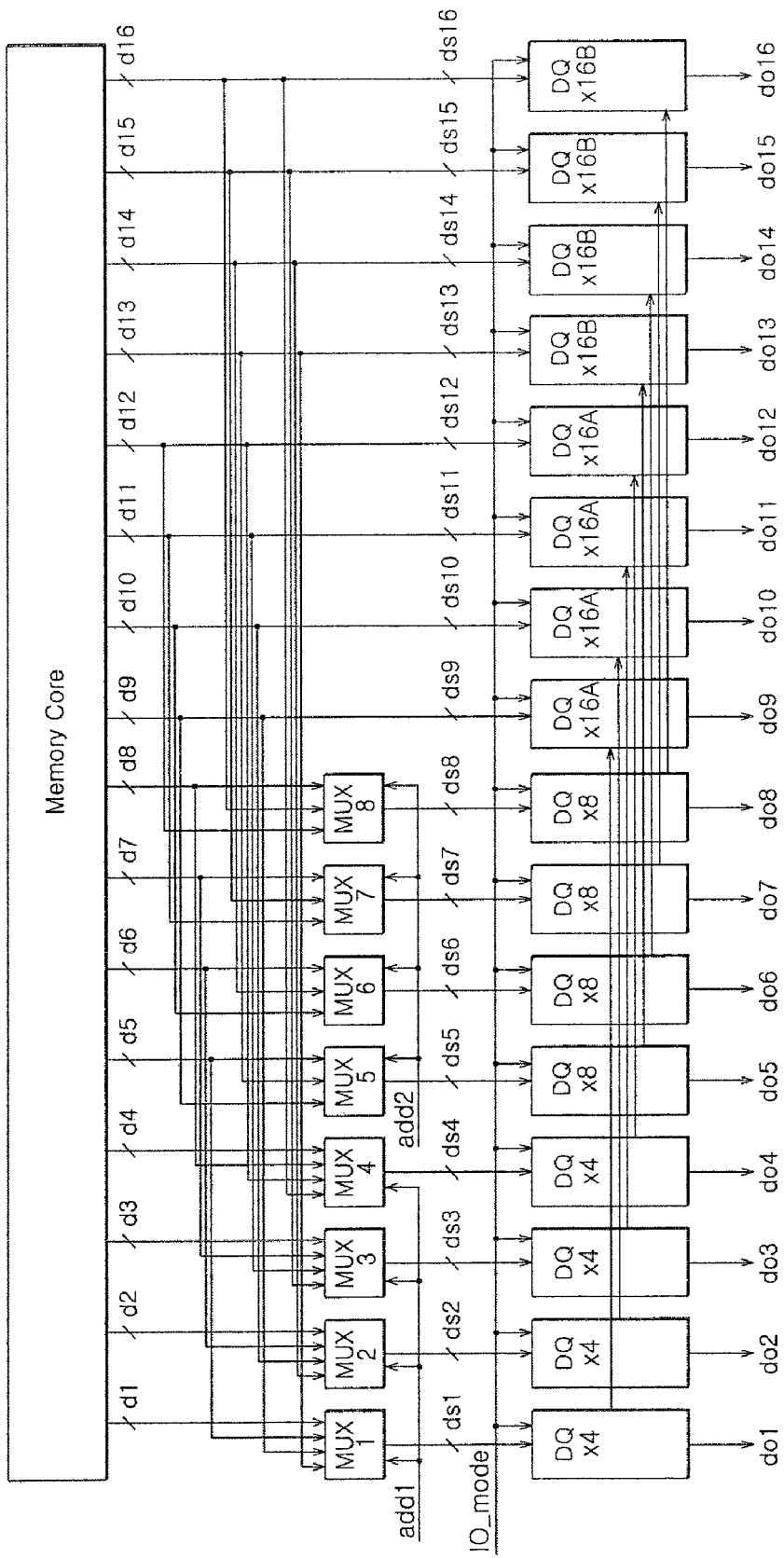
FIG. 7 is a schematic view illustrating an exemplary semiconductor memory apparatus to which the fourth embodiment is to applied.
Figure 8:
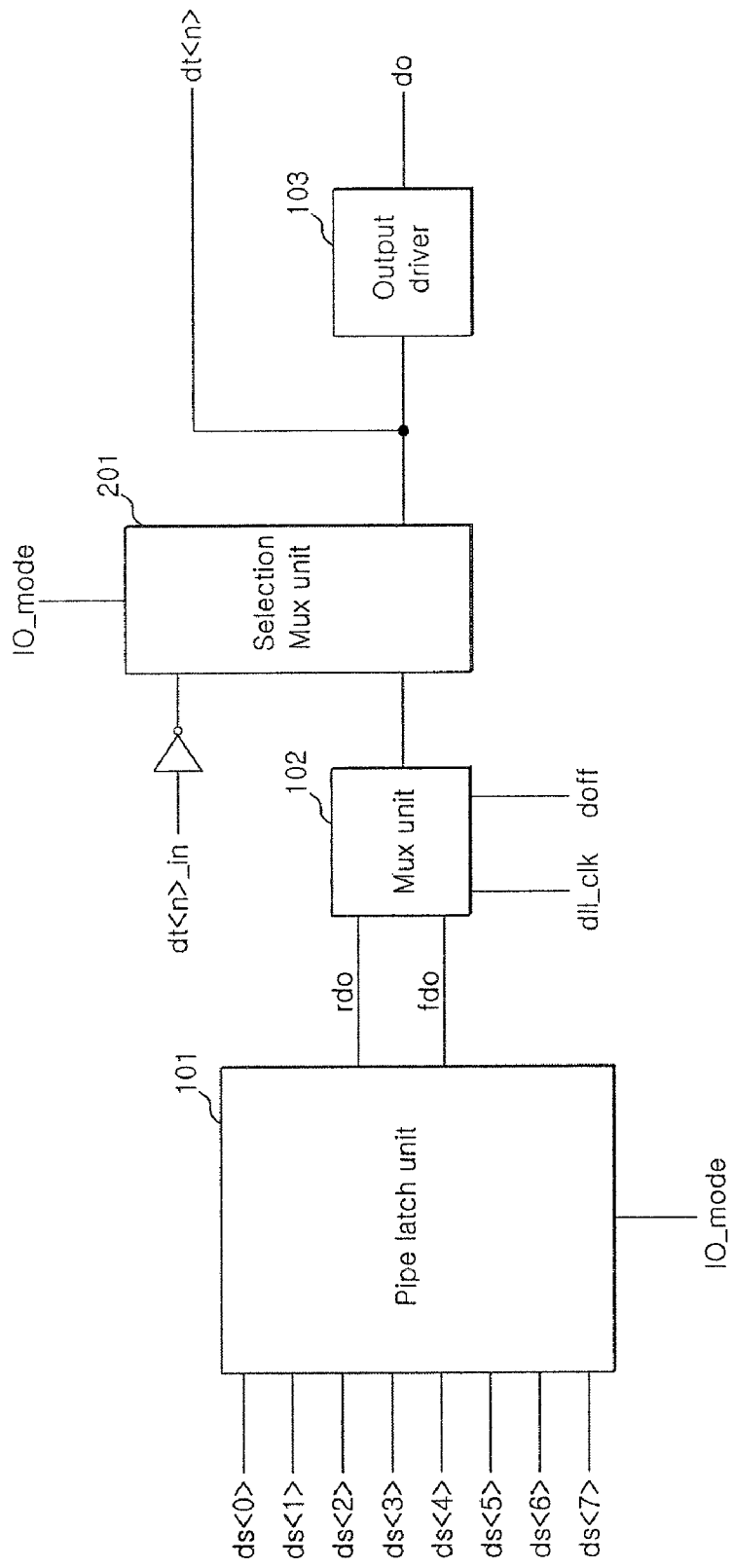
FIG. 8 is a schematic view showing the configuration of the DQ blocks shown in FIG. 7.

FIG. 7 is a schematic view showing an exemplary semiconductor memory apparatus to which the fourth embodiment is applied, and FIG. 8 is a schematic view showing the configuration of the DQ blocks shown in FIG. 7.

When compared to the semiconductor memory apparatus shown in FIG. 5, the semiconductor memory apparatus shown in FIG. 7 is not provided with the ninth through sixteenth muxes MUX9 through MUX16 and has DQ blocks which are configured in a different way. Each DQ block may be configured by adding a mux to the conventional DQ block.

In FIG. 8, the DQ block of FIG. 8 includes an additional selection mux unit 201 that is not provided in the DQ block of FIG. 6. The selection mux unit 201 is configured to output the data synchronized with a DLL clock signal 'dll_clk' among selection data 'ds<0:7>', wherein one of the output of a mux unit 102 and the data obtained by inverting the transmission data 'dt<n>_in' inputted from another DQ block which matches the DQ block, in response to the input and output mode signal 'IO_mode' inputted depending upon an input and output mode. The data 'dt<n>' outputted by the selection mux unit 201 is generated as the output data 'do' through an output driver 103 and is applied to another DQ block which matches the DQ block.

Although exemplary embodiments have been described for illustrative purposes, those skilled in the art will appreciate that various modifications, additions and substitutions are possible, without departing from the scope and the spirit as disclosed in the accompanying claims.

What is claimed is:

1. A semiconductor memory apparatus comprising:
   a data selection section configured to receive first and second data and output one of the first and second data as first selection data in response to an address signal;
   a first data output section configured to receive the first selection data and generate first transmission data and first output data depending upon the first selection data; and
   a second data output section configured to receive the second data and the first transmission data and generate one of the second data and the first transmission data as second output data depending upon an input and output mode.

2. The semiconductor memory apparatus according to claim 1, wherein the input and output mode comprises:
   a first input and output mode and a second input and output mode, and
   wherein the second data output section generates the second output data according to a data obtained by inverting the first transmission data in the first input and output mode and the second output data according to the second data in the second input and output mode.

3. The semiconductor memory apparatus according to claim 1, wherein the first data output section receives the first selection data applied in parallel and generates the first transmission data and the first output data to be outputted in series.

4. The semiconductor memory apparatus according to claim 1, wherein the second data output section receives the second data applied in parallel and the first transmission data applied in series and generates the second output data to be outputted in series.

5. A semiconductor memory apparatus comprising:
   a first data selection section configured to receive first through fourth data and output one of the first through fourth data as first selection data in response to a first address signal;
   a second data selection section configured to receive the is second through fourth data and output one of the second through fourth data as second selection data in response to a second address signal;
   a first data output section configured to be activated depending upon an input and output mode, and inputted with the first selection data and generate first transmission data and first output data;
   a second data output section configured to be activated depending upon the input and output mode, and inputted with the second selection data and generate second transmission data and second output data;
   a third data output section configured to be activated depending upon the input and output mode, and inputted with the third data and the first transmission data and output one of the third data and the first transmission data as third output data depending upon the input and output mode; and
   a fourth data output section configured to be activated depending upon the input and output mode, and inputted with the fourth data and the second transmission data and output one of the fourth data and the second transmission data as fourth output data depending upon the input and output mode.

6. The semiconductor memory apparatus according to claim 5, wherein the input and output mode comprises:
   a first through third input and output modes, and
   wherein the third data output section generates the third output data according to a data obtained by inverting the first transmission data in the first and second input and output modes and the third output data according to the third data in the third input and output mode.

7. The semiconductor memory apparatus according to claim 6, wherein the fourth data output section generates the fourth output data according to a data by inverting the second transmission data in the second input and output mode and the fourth output data according to the fourth data in the third input and output mode.

8. The semiconductor memory apparatus according to claim 5, wherein the first data output section receives the first selection data applied in parallel and generates the first transmission data and the first output data to be outputted in series.

9. The semiconductor memory apparatus according to claim 5, wherein the second data output section receives the second selection data applied in parallel and generates the second transmission data and the second output data to be outputted in series.

10. The semiconductor memory apparatus according to claim 5, wherein the third data output section receives the third data applied in parallel and the first transmission data applied in series and generates the third output data to be outputted in series.

11. The semiconductor memory apparatus according to claim 5, wherein the fourth data output section receives the fourth data applied in parallel and the second transmission data applied in series and generates the fourth output data to be outputted in series.

* * * * *